US010461634B2

(12) United States Patent
Huang

(10) Patent No.: US 10,461,634 B2
(45) Date of Patent: Oct. 29, 2019

(54) CHARGE PUMP CIRCUIT FOR PROVIDING VOLTAGES TO MULTIPLE SWITCH CIRCUITS

(71) Applicant: FAIRCHILD SEMICONDUCTOR CORPORATION, Sunnyvale, CA (US)

(72) Inventor: Lei Huang, Beijing (CN)

(73) Assignee: FAIRCHILD SEMICONDUCTOR CORPORATION, Phoenix, AZ (US)

( * ) Notice: Subject to any disclaimer, the term of this patent is extended or adjusted under 35 U.S.C. 154(b) by 0 days.

(21) Appl. No.: 15/203,490

(22) Filed: Jul. 6, 2016

(65) Prior Publication Data

US 2016/0315534 A1 Oct. 27, 2016

Related U.S. Application Data

(62) Division of application No. 14/722,778, filed on May 27, 2015, now Pat. No. 9,413,231.

(60) Provisional application No. 62/086,967, filed on Dec. 3, 2014.

(51) Int. Cl.
| | |
|---|---|
| *G11C 5/14* | (2006.01) |
| *H02M 3/07* | (2006.01) |
| *H03K 17/06* | (2006.01) |
| *G05F 3/26* | (2006.01) |
| *H03K 17/687* | (2006.01) |
| *H02M 1/088* | (2006.01) |

(52) U.S. Cl.
CPC .............. *H02M 3/07* (2013.01); *G05F 3/262* (2013.01); *G11C 5/145* (2013.01); *H03K 17/063* (2013.01); *H03K 17/687* (2013.01); *H02M 1/088* (2013.01)

(58) Field of Classification Search
CPC ......... H02M 3/07; H02M 1/088; G11C 5/145; H03K 17/06; H03K 17/063; H03K 17/04123; H03K 17/687; G05F 3/262
See application file for complete search history.

(56) References Cited

U.S. PATENT DOCUMENTS

| | | |
|---|---|---|
| 6,759,888 B1 | 7/2004 | Wodnicki |
| 6,788,128 B2 | 9/2004 | Tsuchida |
| 7,579,880 B2 | 8/2009 | Ueda |
| 8,004,340 B2 | 8/2011 | Guo et al. |
| 9,413,231 B2 | 8/2016 | Huang |
| 2015/0028922 A1 | 1/2015 | Turkson et al. |
| 2015/0256171 A1* | 9/2015 | Wong .................. H03K 17/687 327/415 |

* cited by examiner

*Primary Examiner* — Jung Kim
(74) *Attorney, Agent, or Firm* — AMPACC Law Group, PLLC

(57) ABSTRACT

A charge pump circuit generates a charge pump voltage that powers a bias circuit. The bias circuit generates a reference current and generates switch currents from the reference current. Gate-source voltages are generated from the switch currents and applied to switching components of switch circuits to connect two nodes. The gate-source voltages can be generated in the bias circuit and provided to the switch circuits. The gate-source voltages can also be generated in the switch circuits.

20 Claims, 12 Drawing Sheets

CHARGE PUMP CIRCUIT FOR PROVIDING VOLTAGES TO MULTIPLE SWITCH CIRCUITS

CROSS-REFERENCE TO RELATED APPLICATIONS

This application is a divisional of U.S. application Ser. No. 14/722,778, filed on May 27, 2015, which claims the benefit of US Provisional Application No. 62/086,967, filed on Dec. 3, 2014, which is incorporated herein by reference in its entirety.

BACKGROUND OF THE INVENTION

1. Field of the Invention

The present invention relates generally to electrical circuits, and more particularly but not exclusively to charge pump and associated circuits.

2. Description of the Background Art

Charge pump circuits convert a direct-current (DC) voltage from one level to another. They are employed in a variety of applications including to provide bias or supply voltages. For example, a charge pump circuit may be employed in electrical circuits that generate a gate-source voltage for a switching component of a switch circuit employed in a computer interface port, such as a Universal Serial Bus (USB) port. Embodiments of the present invention provide an improved charge pump circuit and circuits that employ a charge pump circuit to generate relatively constant voltages for multiple switch circuits.

SUMMARY

In one embodiment, a charge pump circuit generates a charge pump voltage that powers a bias circuit. The bias circuit generates a reference current and generates switch currents from the reference current. Gate-source voltages are generated from the switch currents and applied to switching components of switch circuits to connect two nodes. The gate-source voltages can be generated in the bias circuit and provided to the switch circuits. The gate-source voltages can also be generated in the switch circuits.

These and other features of the present invention will be readily apparent to persons of ordinary skill in the art upon reading the entirety of this disclosure, which includes the accompanying drawings and claims.

DESCRIPTION OF THE DRAWINGS

The use of the same reference label in different drawings indicates the same or like components.

DETAILED DESCRIPTION

In the present disclosure, numerous specific details are provided, such as examples of electrical circuits ("circuits"), components, and methods, to provide a thorough understanding of embodiments of the invention. Persons of ordinary skill in the art will recognize, however, that the invention may be practiced without one or more of the specific details. In other instances, well-known details are not shown or described to avoid obscuring aspects of the invention.

Figure 1:
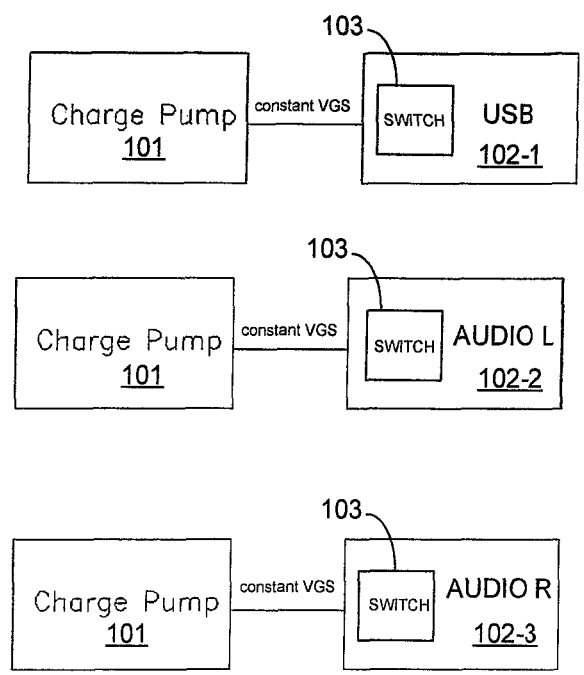
FIG. 1 shows a block diagram of an example electrical circuit for providing voltages to a plurality of computer interface ports.

FIG. 1 shows a block diagram of an example electrical circuit for providing voltages to a plurality of computer interface ports 102 (i.e., 102-1, 102-2, 102-3, . . . , 102-n). In the example of FIG. 1, the computer interface port 102-1 is a Universal Serial Bus (USB) port, the computer interface port 102-2 is an audio left port, and the computer interface port 102-3 is an audio right port. In the example of FIG. 1, each computer interface port 102 has a switch circuit 103 that receives a constant gate-source voltage, hereinafter "voltage VGS", from its own, separate charge pump circuit 101. The constant voltage VGS is applied to a gate and a source of a switching component, e.g., a metal oxide semiconductor transistor (MOS) transistor, of the switch circuit 103. Accordingly, three charge pump circuits 101 are needed for three computer interface ports 102. The circuit of FIG. 1 may be employed in a Micro USB switch (MUS) device, for example. One problem with the circuit of FIG. 1 is that it uses several charge pump circuits 101. Another problem is that because a gate of a switching component of a switch circuit 103 is directly connected to a corresponding charge pump circuit 101, charge pump clock noise from the charge pump circuit 101 may be coupled to the switch circuit 103.

Figure 2:
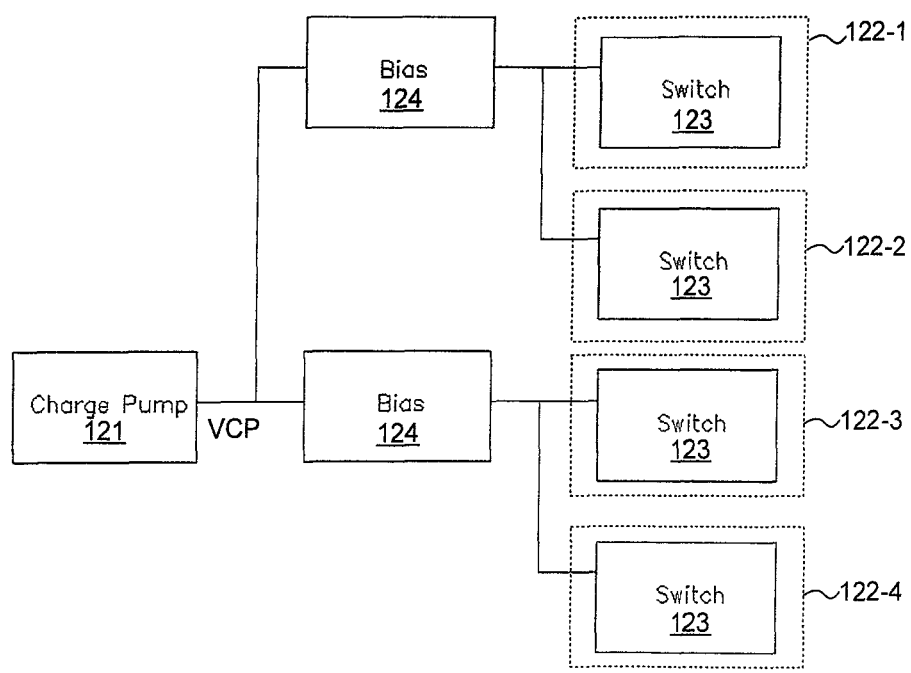
FIG. 2 shows a block diagram of an electrical circuit for providing voltages to a plurality of switch circuits in accordance with an embodiment of the present invention

FIG. 2 shows a block diagram of an electrical circuit for providing voltages to a plurality of switch circuits in accordance with an embodiment of the present invention. In the example of FIG. 2, the electrical circuit includes a charge pump circuit 121 that is configured to generate a plurality of relatively constant (i.e., in the engineering sense) voltages VGS for a plurality of switch circuits 123. A switch circuit 123 may be part of a computer interface port 122 (i.e., 122-1, 122-2, 122-3, 122-4, . . . , 122-n).

In the example of FIG. 2, the charge pump circuit 121 generates a charge pump voltage VCP for one or more bias circuits 124. A bias circuit 124 advantageously prevents or minimizes noise generated in the charge pump circuit 121 from being coupled to a switch circuit 123. A bias circuit 124 may receive the charge pump voltage VCP generated by the charge pump circuit 121 and generate a switch current that may be employed to generate a constant voltage VGS for a switching component of a switch circuit 123. More particularly, a current reference generated by a current source of the bias circuit 124 may be mirrored to generate a switch current that flows into an impedance to generate a fixed voltage drop, which may be used as a voltage VGS of a switching component of a switch circuit 123. When the current source has relatively good power supply rejection ratio (PSRR), the reference current it generates may be considered a constant current with small variation. Accordingly, the resulting voltage VGS is also constant. In the example of FIG. 2, switch circuits 123 that are relatively close to a bias circuit 124 may receive a relatively constant voltage VGS.

Figure 3:
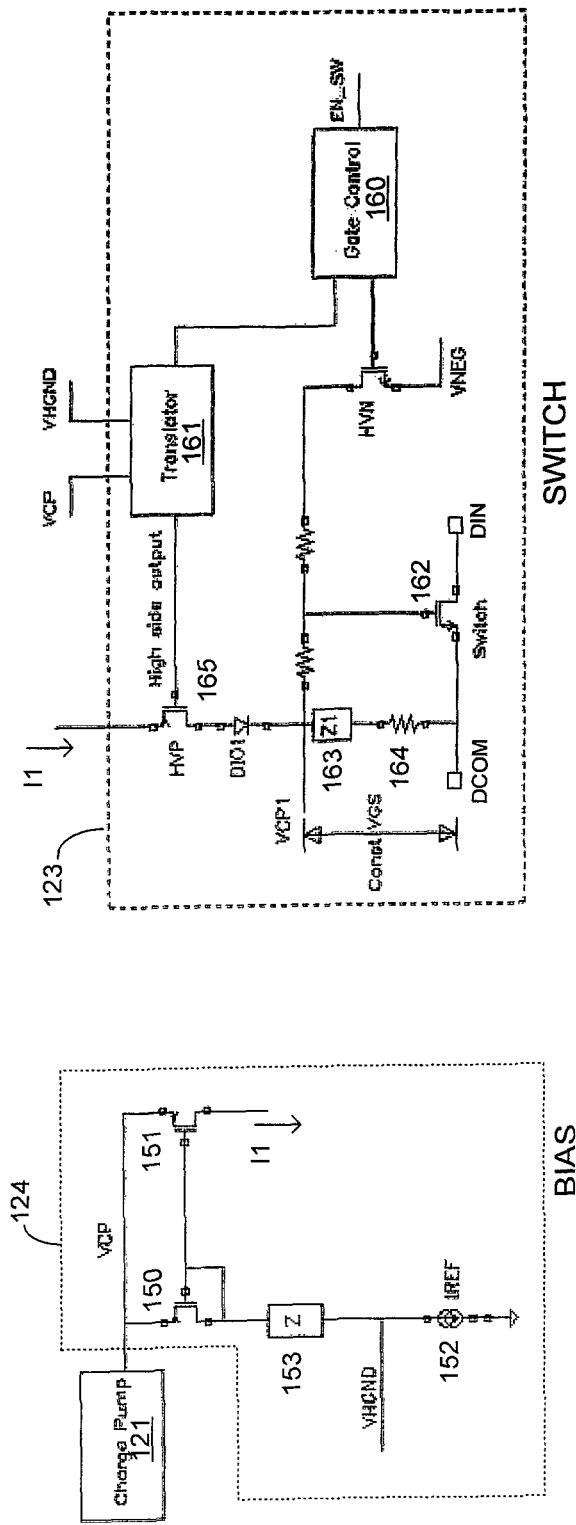
FIG. 3 shows a schematic diagram of an electrical circuit for providing voltages to a plurality of switch circuits in accordance with an embodiment of the present invention.

FIG. 3 shows a schematic diagram of an electrical circuit for providing voltages to a plurality of switch circuits in accordance with an embodiment of the present invention. FIG. 3 shows an example topology where a constant voltage VGS for a switch component of a switch circuit is generated in the switch circuit using a switch current generated by the bias circuit. The circuit of FIG. 3 may include a plurality of switch circuits per one charge pump circuit, but only one switch circuit is shown for clarity of illustration.

In the example of FIG. 3, a bias circuit 124 is powered by a charge pump voltage VCP generated by a charge pump circuit 121. The bias circuit 124 includes a current source 152 that generates a fixed reference current IREF. A current mirror formed by the transistors 150 and 151 mirrors the reference current IREF to generate a switch current in the form of a mirrored current I1, which may be received by a switch circuit 123 or shared by a plurality of switch circuits 123. The mirrored current I1 may be employed to generate a constant voltage VGS in one or more switch circuits 123. Accordingly, a single charge pump circuit 121 allows for generating a constant voltage VGS for a plurality of switch circuits 123. As can be appreciated, a system may include a plurality of charge pump circuits 121, with one charge pump circuit 121 in the plurality of charge pump circuits 121 providing constant voltages VGS to a plurality of switch circuits 123.

In the example of FIG. 3, an impedance element 153 has an impedance Z. In general, an impedance element may be a regular diode, a Zener diode, a MOS transistor, a resistor, or other electrical component for generating a fixed voltage drop from the fixed reference current IREF or mirrored current I1.

In the example of FIG. 3, a switch circuit 123 includes a gate control circuit 160 that receives an enable signal EN_SW for enabling or disabling the switch circuit 123. When the switch circuit 123 is enabled, the mirrored current I1 is received by the switch circuit 123 from the bias circuit 124 to develop a voltage drop on a resistor 164 and on an impedance element 163 that has an impedance Z1. In the example of FIG. 3, the voltage drops on the resistor 164 and the impedance element 163 are referred to as a charge pump voltage VCP1, which provides a constant voltage VGS on the switch circuit 123, more specifically on the transistor 162 (e.g., MOS transistor) that connects a data input node (DIN) to a data common node (DCOM). In the example of FIG. 3, the transistor 162 is the switching component of the switch circuit 123, and may be turned ON or OFF by the gate control circuit 160 based on the switch enable signal EN_SW. Enabling the switch circuit 123 turns ON the transistor 162 to connect the data input node DIN to the data common node DCOM; disabling the switch circuit 123 turns OFF the transistor 162 to disconnect the data input node DIN from the data common node DCOM.

In the example of FIG. 3, a diode DI01 blocks reverse conduction when the voltage VCP1 becomes greater than the voltage VCP. In the example of FIG. 3, the switch circuit 123 includes a voltage translator circuit 161, which receives the charge pump voltage VCP as a bias voltage. The voltage translator circuit 161 may receive a bias ground reference VHGND from a node connecting the current source 152 and impedance element 153 of the bias circuit 124. As will be more apparent below (see FIG. 5), the voltage translator circuit 161 may have a high side output and a full swing output. The high side output of the voltage translator circuit 161 is employed in the example of FIG. 3 to drive a transistor 165, which receives the mirrored current I1 into the switch circuit 123.

Figure 4:
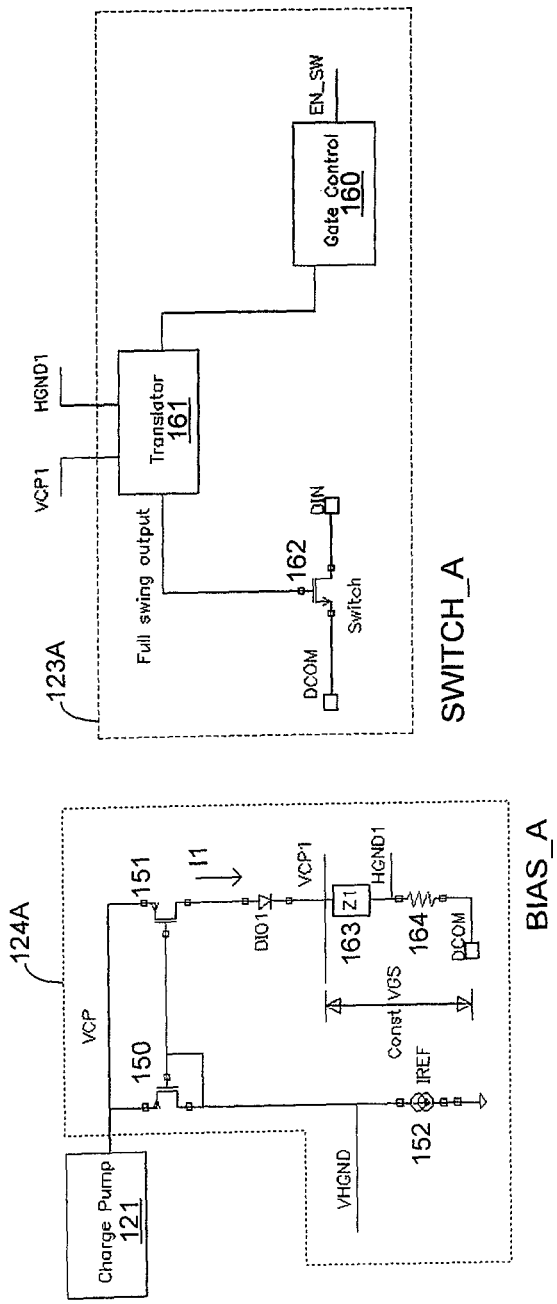
FIG. 4 shows a schematic diagram of an electrical circuit for providing voltages to a plurality of switch circuits in accordance with another embodiment of the present invention.

FIG. 4 shows a schematic diagram of an electrical circuit for providing voltages to a plurality of switch circuits in accordance with another embodiment of the present invention. FIG. 4 shows an example topology where a constant voltage VGS for a switch component of a switch circuit is generated in the bias circuit. The circuit of FIG. 4 may include a plurality of switch circuits per one charge pump circuit, but only one switch circuit is shown for clarity of illustration.

In the example of FIG. 4, the bias circuit 124A is a particular implementation of a bias circuit 124. In the example of FIG. 4, the bias circuit 124A is powered by a charge pump voltage VCP generated by a charge pump circuit 121. Similar to the bias circuit 124, the bias circuit 124A also includes the current source 152 that generates a reference current IREF and the current mirror formed by the transistors 150 and 151. The current mirror mirrors the reference current IREF to generate the mirrored current I1, which is employed as a switch current to generate a voltage VGS.

In the example of FIG. 4, the bias circuit 124A further includes the diode D101, the impedance element 163, and the resistor 164. The mirrored current I1 develops a voltage drop on the impedance element Z1 and on the resistor 164 to generate the charge pump voltage VCP1. A bias ground reference HGND1 may be taken on a node connecting the impedance element Z1 and the resistor 164. The bias ground reference HGND1 may be shared by a plurality of switch circuits 123A that share the same data common node DCOM. The charge pump voltage VCP1 may be used as a constant voltage VGS of a transistor 162. That is, as before, a single charge pump circuit 121 may provide a constant voltage VGS to a plurality of switch circuits 123A.

In the example of FIG. 4, the switch circuit 123A is a particular implementation of a switch circuit 123. The switch circuit 123A includes the gate control circuit 160 that receives a switch enable signal EN_SW for enabling or disabling the switch circuit 123A. The switch circuit 123A further includes the voltage translator circuit 161, which in the example of FIG. 4 receives the charge pump voltage VCP1 and the bias ground reference HGND1 from the bias circuit 124A.

In the example of FIG. 4, the voltage translator circuit 161 controls the ON or OFF state of the transistor 162, which is the switching component of the switch circuit 123A. In the example of FIG. 4, the voltage translator circuit 161 uses the full swing output of the voltage translator circuit 161 to control the gate of the transistor 162 to turn the transistor 162 ON or OFF. More specifically, the source of the transistor 162 is connected to the end of the resistor 164 that is connected to the data common node DCOM, while the gate of the transistor 162 is connected to the charge pump voltage VCP1 through the voltage translator circuit 161. Accordingly, when the switch 123A is enabled, transistor 162 is turned ON by connecting the charge pump voltage VCP1 across the gate and source of the transistor 162 through the voltage translator circuit 161. The voltage translator circuit 161 removes the charge pump voltage VCP1 from the transistor 162 to turn the transistor 162 OFF when the switch 123A is disabled.

In the example of FIGS. 3 and 4, a current source 152 generates the reference current IREF, which may be mirrored to generate one or more mirrored currents I1. The reference current IREF or each of the mirrored currents I1 may generate a voltage drop on an impedance element 163. The voltage drop may be used as a gate-source voltage VGS of a transistor 162 that is being used as a switching component of a switch circuit. The current source 152 preferably has a good PSRR such that the reference current IREF and the mirrored currents I1 are constant, thereby resulting in constant voltage drops employed as voltages VGS.

Figure 5:
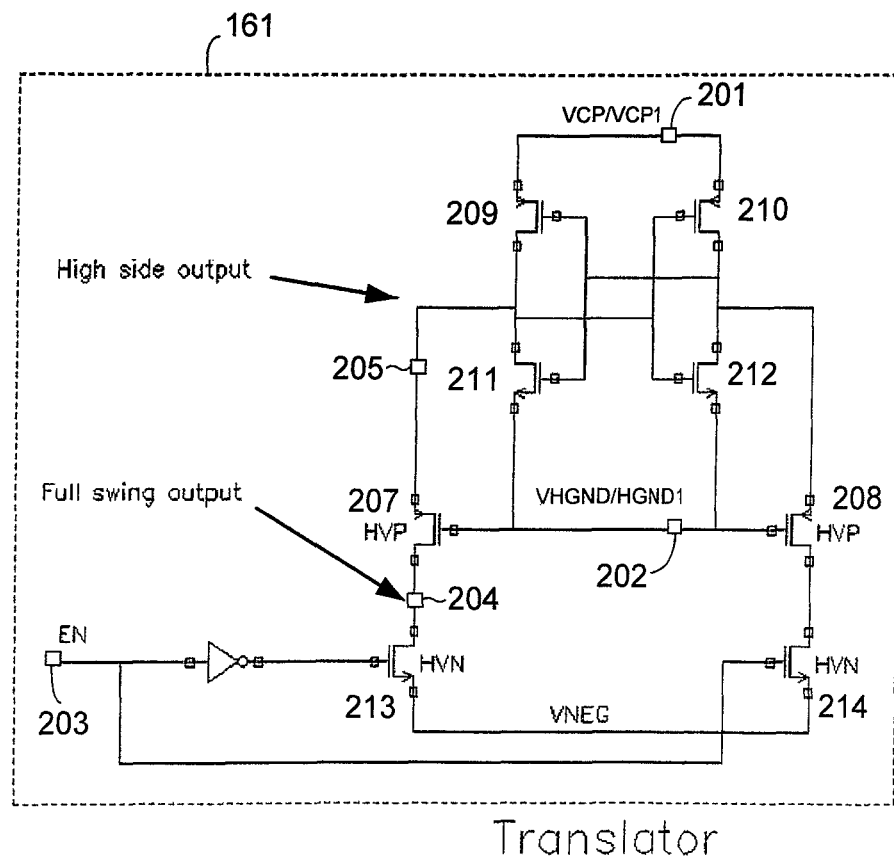
FIG. 5 shows a schematic diagram of a voltage translator circuit in accordance with an embodiment of the present invention.

FIG. 5 shows a schematic diagram of a voltage translator circuit 161 in accordance with an embodiment of the present invention. In one embodiment, the voltage translator circuit 161 is a low voltage to high voltage translator. The voltage translator circuit 161 may increase a charge pump voltage to a level sufficient to drive a transistor in a switch circuit.

In the example of FIG. 5, the voltage translator 161 includes a node 201 for receiving a charge pump voltage, such as a charge pump voltage VCP (see FIG. 3) or VCP1 (see FIG. 4). The voltage translator circuit 161 further includes a node 202 for receiving a bias ground reference, such as a bias ground reference VHGND (see FIG. 3) or HGND1 (see FIG. 4).

In the example of FIG. 5, the voltage translator circuit 161 generates a high side output at a node 205 and a full swing output at a node 204. The high side output may be employed in embodiments where a mirrored current flows in each of the switch circuits to develop the constant voltage VGS in each of the switch circuits. More particularly, the high side output may be employed to drive a transistor 165 in a switch circuit 123 (see FIG. 3). The full swing output of the voltage translator circuit 161 may be employed in embodiments where a mirrored current is flown in the bias circuit to develop the voltage VGS in the bias circuit and then translate the voltage VGS in the switch circuits. More particularly, the full swing output of the voltage translator circuit 161 may be employed to drive a transistor 162 in a switch circuit 123A (e.g., see FIG. 4).

In the example of FIG. 5, the voltage translator circuit 161 includes a node 203 for receiving an enable signal EN. The enable signal EN may be received from the gate control circuit 160. The enable signal EN controls the transistors 213 and 214 to enable or disable the voltage translator circuit 161.

In the example of FIG. 5, when the enable signal EN is HIGH, the high voltage NMOS transistor 214 is ON, the high voltage NMOS transistor 213 is OFF, and the drain of the high voltage PMOS transistor 208 is pulled down by the NMOS transistor 214. This results in the source of the PMOS transistor 208 also being pulled down. The MOSFETs 209-212 form a two-inverter latch. Pulling down the source of the PMOS transistor 208 also pulls down the drains of the MOSFETS 210 and 212, thereby latching the state to provide the charge pump voltage (VCP) on the node 205. In a similar manner, when the enable signal EN is LOW, the latch state is to provide the bias reference ground (VHGND) on the node 205. This results in the node 205 swinging from VHGND to VCP. The full swing output operates in a similar fashion, except that the node 204 swings from VNEG to VCP1.

Figure 6:
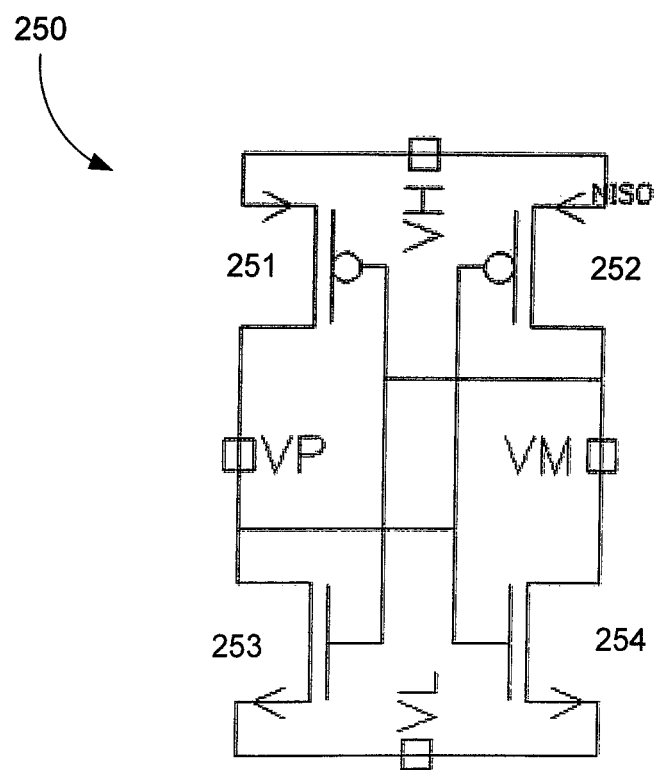
FIG. 6 shows a schematic diagram of a charge pump cell in accordance with an embodiment of the present invention.

FIG. 6 shows a schematic diagram of a charge pump cell 250 in accordance with an embodiment of the present invention. As its name implies, the charge pump cell 250 is a cell for a charge pump circuit. In the example of FIG. 6, the charge pump cell 250 converts an input voltage at an input node VL to a charge pump voltage at an output node VH. Generally speaking, the input node VL receives a low voltage and the output node VH outputs a higher voltage. A plurality of charge pump cells 250 may be connected in series, with an output node of one feeding the input node of another, to increase the overall charge pump voltage. The charge pump cell 250 may include nodes VP and VM for receiving charge pump clock pulses.

Figure 7:
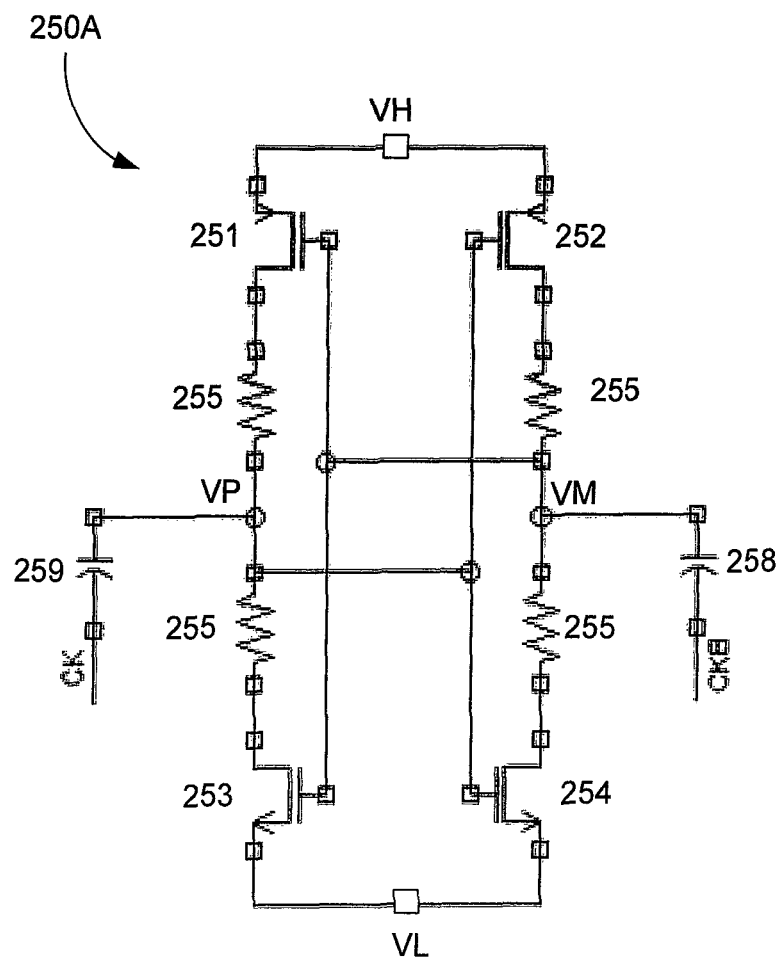
FIG. 7 shows a schematic diagram of a charge pump cell in accordance with another embodiment of the present invention.

FIG. 7 shows a schematic diagram of a charge pump cell 250A in accordance with another embodiment of the present invention. The charge pump cell 250A is a particular implementation of the charge pump cell 250. In some implementations, the drain to bulk voltage Vdb may turn ON parasitic NPN devices in MOS transistors, such as transistors 251-254. In the charge pump 250A, resistors 255 are added to reduce drain to bulk voltage Vdb. The charge pumps 250 and 250A are otherwise the same and operate in similar fashion.

In the example of FIG. 7, the charge pump clock pulses CK and CKB are reverting signals, i.e., CKB is LOW when CK is HIGH, and CKB is HIGH when CK is LOW. When CK is HIGH, CKB is LOW, the node VP is HIGH, the node VM is LOW, and the NMOS transistor 254 and the PMOS transistor 251 are turned ON. This results in the capacitor 258 being charged through the NMOS transistor 254, and the capacitor 259 discharging to the node VH through the PMOS transistor 251. Similarly, in a next phase when CK is LOW and CKB is HIGH, the capacitor 259 is charged and the capacitor 258 discharges to the node VH.

Figure 8:
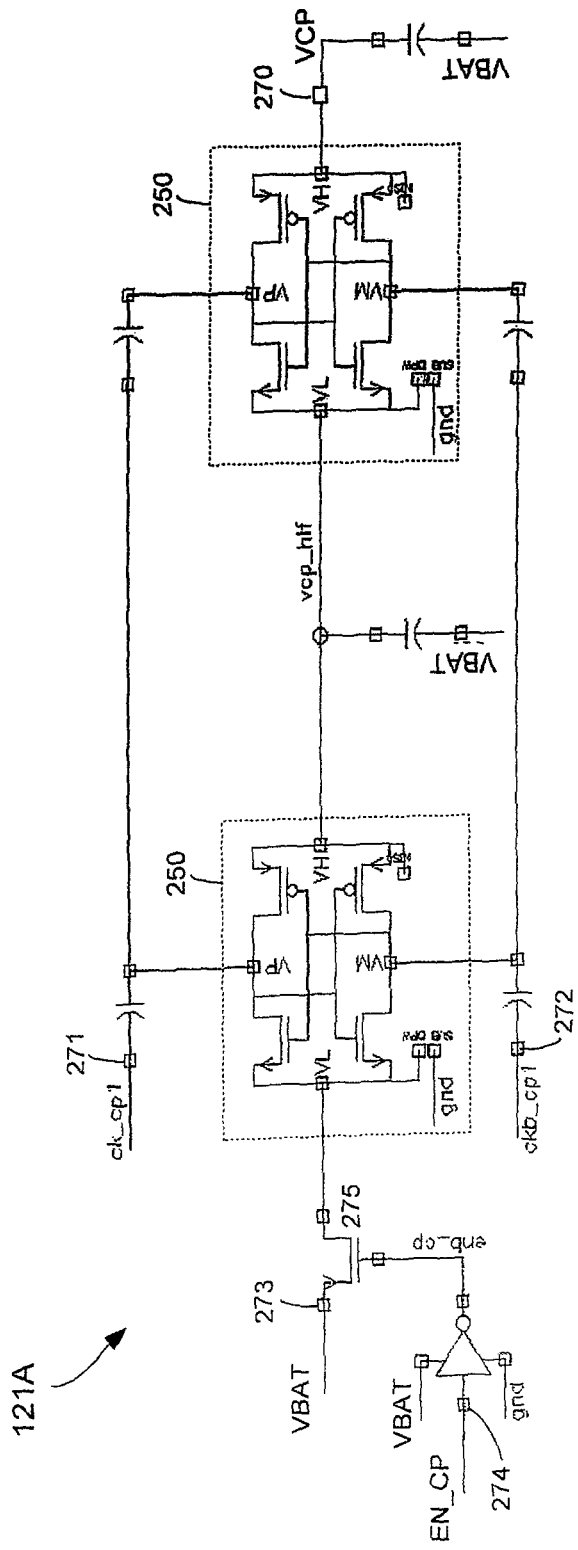
FIG. 8 shows a schematic diagram of a charge pump circuit with multiple charge pump cells in accordance with an embodiment of the present invention.

FIG. 8 shows a schematic diagram of a charge pump circuit 121A in accordance with an embodiment of the present invention. The charge pump circuit 121A is a particular implementation of a charge pump circuit 121.

In the example of FIG. 8, the charge pump circuit 121A includes two charge pump cells 250 (or 250A) that are connected in series. The charge pump circuit 121A receives a battery voltage VBAT at a node 273 (and other nodes) and converts the battery voltage VBAT to a charge pump voltage VCP at the node 270. The charge pump circuit 121A includes a node 274 for receiving a charge pump enable signal EN_CP. The charge pump enable signal EN_CP controls an input transistor 275 for enabling or disabling the charge pump circuit 121A. The charge pump circuit 121A receives charge pump clock pulses CK_CP1 and CKB_CP1 at the nodes 271 and 272, respectively. In the example of FIG. 8, the charge pump voltage VCP at the node 270 is equal to 3*VBAT (i.e., 3×the battery voltage). That is, the maximum charge pump voltage VCP is 3*VBAT. This allows for a smaller charge pump voltage and avoids safe operating area (SOA) problems.

Figure 9:
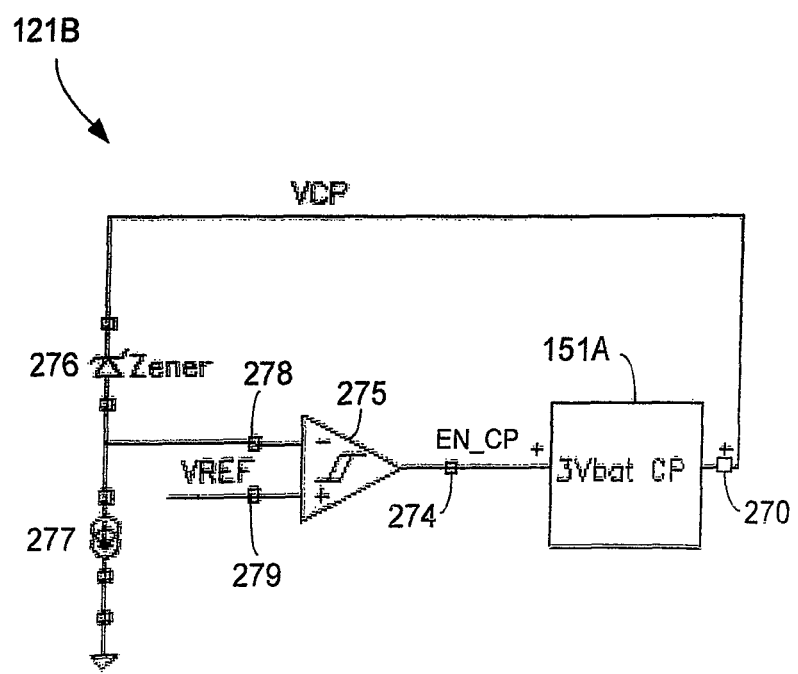
FIG. 9 shows a charge pump circuit in accordance with another embodiment of the present invention.

FIG. 9 shows a charge pump circuit 121B in accordance with another embodiment of the present invention. The charge pump circuit 121B is a particular implementation of a charge pump circuit 121.

In the example of FIG. 9, the charge pump circuit 121B controls the charge pump circuit 121A (see FIG. 8) to generate a charge pump voltage VCP at the node 270 (shown also in FIG. 8) that is equal to the battery voltage VBAT plus a Zener voltage drop (VZ) on the Zener diode 276. In the example of FIG. 9, a hysteresis comparator 275 compares the charge pump voltage VCP plus Zener voltage drop at a node 278 to a threshold reference voltage VREF at a node 279 to generate the charge pump enable signal EN_CP, which is input to the charge pump circuit 121A at the node 274 (shown also in FIG. 8). A current sink 277 is coupled to the node 278.

In the example of FIG. 9, the charge pump voltage VCP at the node 270 may be described as VREF+VZ, with VZ being the Zener voltage drop on the Zener diode 276. For example, assuming a comparator 275 hysteresis with two thresholds VTP and VTN, the charge pump voltage VCP is in the range VZ+VREF (which is +VTP or −VTN). VREF+VZ is VBAT+VZ when VREF is set to be VBAT.

Figure 10:
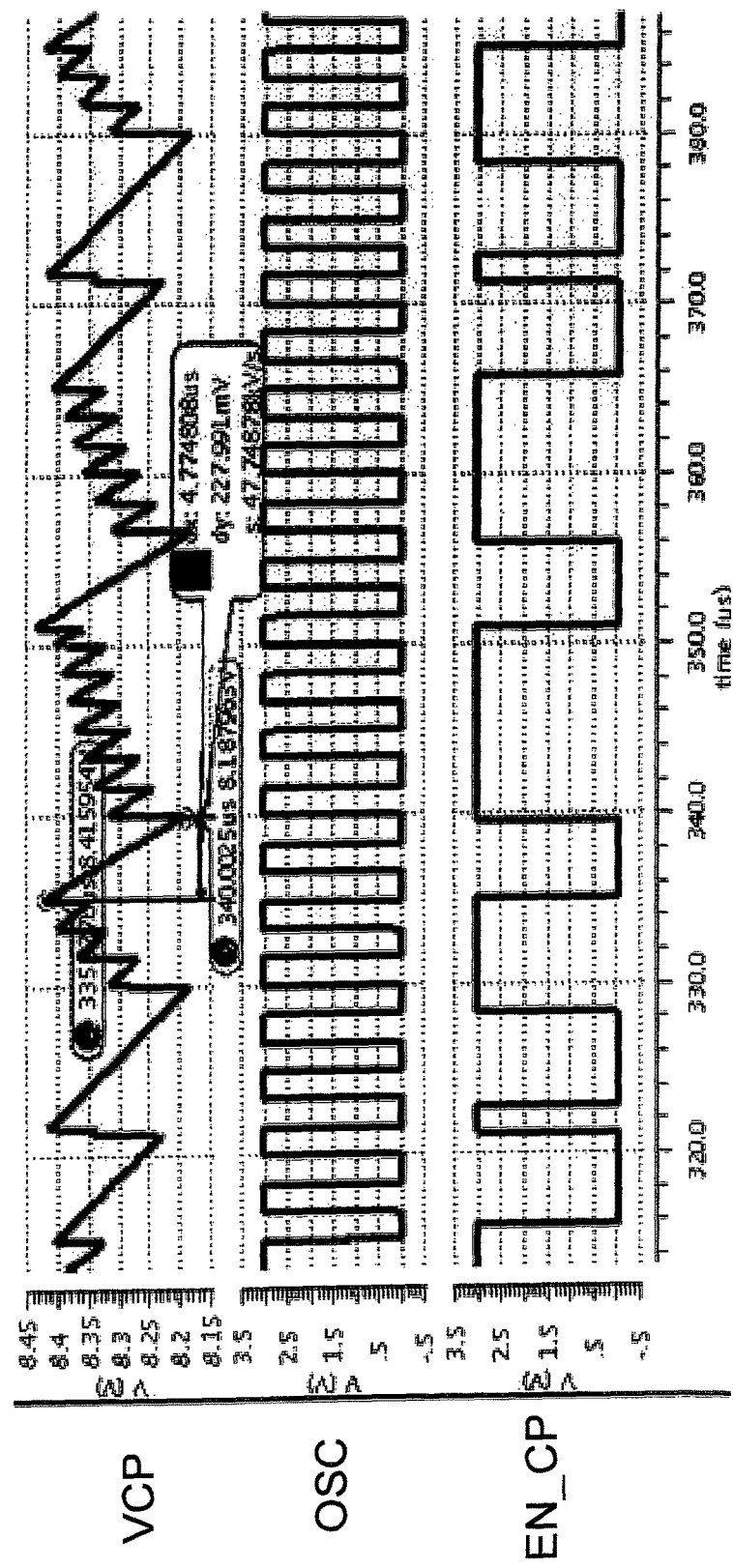
FIG. 10 shows simulated waveforms of the charge pump circuit of FIG. 9 in accordance with an embodiment of the present invention.

FIG. 10 shows simulated waveforms of the charge pump circuit 121B in accordance with an embodiment of the present invention. FIG. 10 shows, from top to bottom, the charge pump voltage (VCP) at the node 270, the charge pump clock (OSC), and the charge pump enable signal (EN_CP).

When the charge pump circuit 121A is disabled, the charge pump enable signal EN_CP drops down by a fixed slew rate because of sink current drawn by the current sink 277. When the charge pump enable signal EN_CP reaches a low threshold voltage VTH (in comparison to the threshold reference voltage VREF), the charge pump circuit 121A is enabled again and the charge pump enable signal EN_CP charges up. The charge pump circuit 121A is thus enabled when the charge pump voltage VCP is too low. When the charge pump enable signal EN_CP reaches a high threshold voltage VTH, the charge pump circuit 121A is disabled again. As can be appreciated, ripple is not an important consideration because only the lowest point of the charge pump enable signal EN_CP needs to be high enough.

Figure 11:
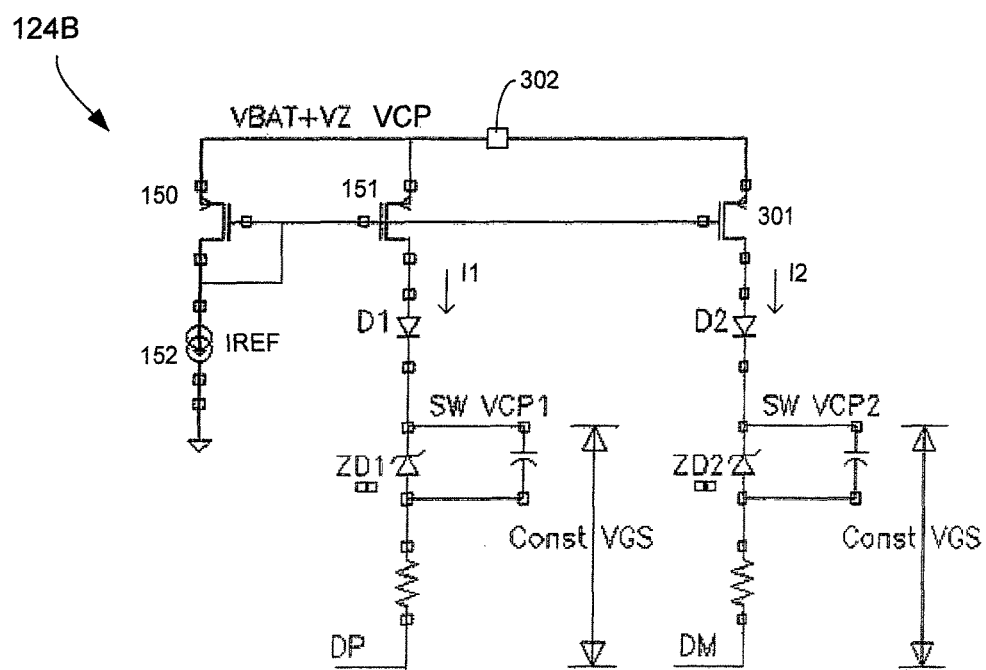
FIG. 11 shows a schematic diagram of a bias circuit in accordance with an embodiment of the present invention.

FIG. 11 shows a schematic diagram of a bias circuit 124B in accordance with an embodiment of the present invention. The bias circuit 124B is a particular implementation of a bias circuit 124.

In the example of FIG. 11, the bias circuit 124B receives a charge pump voltage VCP that is equal to a battery voltage VBAT plus the Zener voltage (VBAT+VZ) at a node 302. In one embodiment, the charge pump voltage VCP at the node 302 is provided by a charge pump circuit 121B (see FIG. 9).

In the example of FIG. 11, the bias circuit 124B includes the current source 152 that generates the current reference IREF. The transistors 150, 151, and 301 form a current mirror that mirrors the current reference IREF to generate mirrored currents I1 and I2. As before, the mirrored currents develop a voltage drop on impedance elements, which are Zener diodes ZD1 and ZD2 in the example of FIG. 11, to generate charge pump voltages SW VCP1 and SW VCP2. When the voltage on the data node DP or data node DM increases, the corresponding charge pump voltage SW VCP (i.e., VCP1 or VCP2) also increases. A diode (diode D1 or D2) blocks the charge pump voltage SW VCP charge back to the charge pump circuit when the charge pump voltage SW VCP becomes greater than VREF+VZ. Note that VREF+VZ may be controlled to a particular value.

Figure 12:
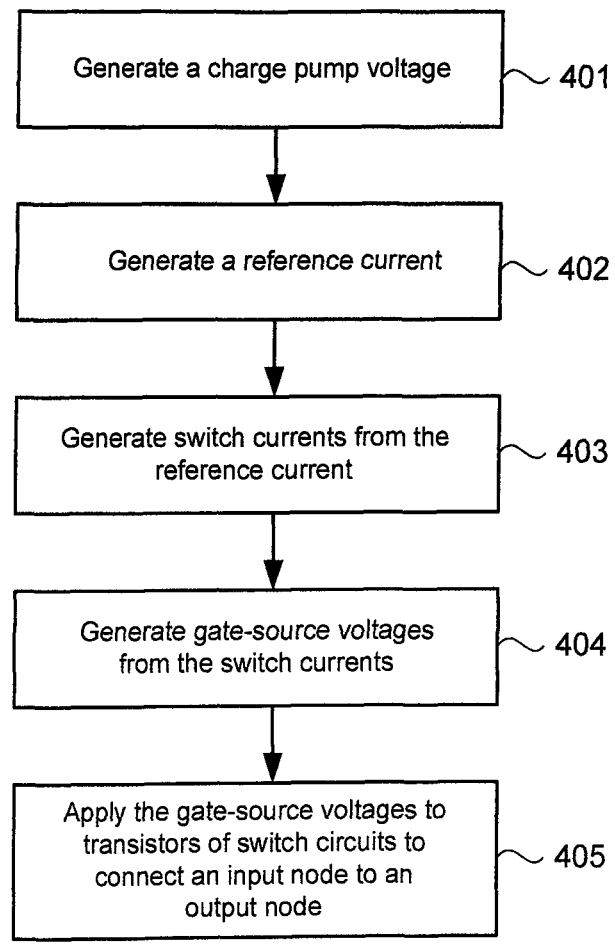
FIG. 12 shows a flow diagram of a method of providing a plurality of constant gate-source voltages to a plurality of switch circuits using a charge pump circuit in accordance with an embodiment of the present invention.

FIG. 12 shows a flow diagram of a method of providing a plurality of constant gate-source voltages to a plurality of switch circuits using a charge pump circuit in accordance with an embodiment of the present invention. The method of FIG. 12 is explained with reference to the above-described circuits and components. As can be appreciated, the method of FIG. 12 may also be performed by other circuits and components.

In the example of FIG. 12, a charge pump circuit generates a charge pump voltage (step 401). A bias circuit that is coupled to the charge pump circuit receives the charge pump voltage to generate a plurality of switch currents. More particularly, the bias circuit may generate a reference current (step 402) and may generate a plurality of switch currents from the reference current (step 403). For example, the bias circuit may comprise a current source that generates the reference current and a current mirror that mirrors the reference current to generate the plurality of switch currents. Constant gate-source voltages may be generated from the plurality of switch currents (step 404). The gate-source voltages may be generated in the bias circuit or in a plurality of switch circuits. For example, the bias circuit may comprise an impedance element that receives a switch current to develop a constant gate-source voltage. As another example, a switch circuit may comprise an impedance element that receives a switch current to develop a constant gate-source voltage.

In the example of FIG. 12, the gate-source voltages are applied to transistors of the switch circuits that connect a first node to a second node (step 405). The first node may be a data common node and the second node may be a data input node. For example, a gate-source voltage may be applied across a gate and a source of an MOS transistor to switch ON the MOS transistor and connect a data input node to a data common node of a computer interface port, such as a USB port.

Methods and circuits for generating a plurality of gate-source voltages using a charge pump circuit have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. An electrical circuit comprising:
   a charge pump circuit that generates a charge pump voltage;
   a bias circuit that receives the charge pump voltage at a first node, generates a reference current, and generates a plurality of switch currents from the reference current, the plurality of switch currents including a first switch current and a second switch current;
   a first switch circuit receiving the first switch current, the first switch current flowing into the first switch circuit, and the first switch circuit including a first transistor, the first transistor having a gate and a source that receive a first gate-source voltage that is generated from the first switch current in the plurality of switch currents;
   a first impedance element and a first capacitor, the first switch current flowing through the first impedance element to generate the first gate-source voltage, the first impedance element and the first capacitor being coupled to each other in parallel; and
   a second switch circuit receiving the second switch current, the second switch current flowing into the second switch circuit, and the second switch circuit including a second transistor, the second transistor having a gate and a source that receive a second gate-source voltage that is generated from the second switch current in the plurality of switch currents.

2. The electrical circuit of claim 1, wherein the first switch circuit further comprises:
   a third transistor having a first terminal into which the first switch current flows and a second terminal, wherein the first impedance element is included in the first switch circuit and is coupled to the second terminal of the third transistor, the first switch current flowing through the first impedance element to develop the first gate-source voltage.

3. The electrical circuit of claim 2, wherein the second switch circuit further comprises:
a fourth transistor having a first terminal into which the second switch current flows and a second terminal; and
a second impedance element coupled to the second terminal of the fourth transistor, the second switch current flowing through the second impedance element to develop the second gate-source voltage.

4. The electrical circuit of claim 1, wherein the bias circuit generates the first gate-source voltage from the first switch current and generates the second gate-source voltage from the second switch current.

5. The electrical circuit of claim 1, wherein the first switch circuit and the second switch circuit are switch circuits of computer interface ports.

6. The electrical circuit of claim 5, wherein the computer interface ports comprise Universal Serial Bus (USB) ports.

7. The electrical circuit of claim 1, wherein the charge pump circuit comprises a plurality of series-connected charge pump cells.

8. An electrical circuit comprising:
a charge pump circuit that is configured to generate a charge pump voltage;
a current source that is configured to generate a fixed reference current;
a current mirror that is configured to receive the charge pump voltage and mirror the fixed reference current to generate a plurality of switch currents;
a first impedance element that is configured to receive a first switch current in the plurality of switch currents to generate a first constant bias voltage;
a first transistor that is configured to switch a first node to a second node, the first transistor being biased by the first constant bias voltage;
a second impedance element that is configured to receive a second switch current in the plurality of switch currents to generate a second constant bias voltage; and
a second transistor that is configured to switch a third node to a fourth node, the second transistor being biased by the second constant bias voltage,
wherein the first impedance element comprises a first Zener diode and a first capacitor is connected across the first Zener diode.

9. The electrical circuit of claim 8, further comprising a first diode having a cathode that is connected to a cathode of the first Zener diode, the first diode having an anode that is connected to the current mirror to receive the first switch current.

10. The electrical circuit of claim 8, wherein the second impedance element comprises a second Zener diode.

11. The electrical circuit of claim 10, further comprising a second diode having a cathode that is connected to a cathode of the second Zener diode, the second diode having an anode that is connected to the current mirror to receive the second switch current.

12. An electrical circuit comprising:
a charge pump circuit that is configured to generate a charge pump voltage;
a current source that is configured to generate a reference current;
a current mirror that is configured to receive the charge pump voltage and to mirror the reference current to generate a first mirrored current through a first transistor and a second mirrored current through a second transistor;
a first impedance element that is connected to the first transistor to receive the first mirrored current and to generate a first constant gate-to-source voltage of a first switch that is configured to switch a first node to a second node, the first impedance element comprising a first Zener diode;
a second impedance element that is connected to the second transistor to receive the second mirrored current and to generate a second constant gate-to-source voltage of a second switch that is configured to switch a third node to a fourth node, the second impedance element comprising a second Zener diode;
a first diode that is in series with the first Zener diode and is connected to the first transistor to receive the first mirrored current; and
a second diode that is in series with the second Zener diode and is connected to the second transistor to receive the second mirrored current.

13. The electrical circuit of claim 12, further comprising a first resistor that is in series with the first Zener diode, wherein the first constant gate-to-source voltage of the first switch is across the first resistor and the first Zener diode.

14. The electrical circuit of claim 13, further comprising a first capacitor across the first Zener diode and a second capacitor across the second Zener diode.

15. The electrical circuit of claim 1, wherein the first switch circuit further comprises a first diode through which the first switch current flows, and
wherein the second switch circuit further comprises a second diode through which the second switch current flows.

16. The electrical circuit of claim 15, wherein the first switch circuit comprises the first impedance element coupled to the first diode in series, and
wherein the second switch circuit further comprises a second impedance element coupled to the second diode in series.

17. The electrical circuit of claim 16, further comprising:
a second capacitor coupled to the second impedance element in parallel.

18. The electrical circuit of claim 1, wherein the first impedance element includes a Zener diode.

19. The electrical circuit of claim 2, wherein the first switch circuit further comprises a first diode that is coupled to the third transistor and the first impedance element in series.

20. The electrical circuit of claim 1, wherein the first impedance element includes a diode having a cathode coupled to a gate of the first transistor.

* * * * *